(12) United States Patent
Onyema et al.

(10) Patent No.: US 10,673,435 B2
(45) Date of Patent: Jun. 2, 2020

(54) REDUCTION OF DYNAMIC SWITCHING CURRENT IN HIGH-SPEED LOGIC

(71) Applicant: NXP USA, Inc., Austin, TX (US)

(72) Inventors: Emmanuel Chukwuma Onyema, Kyle, TX (US); David Russell Tipple, Leander, TX (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 16/176,926

(22) Filed: Oct. 31, 2018

(65) Prior Publication Data

US 2020/0136619 A1  Apr. 30, 2020

(51) Int. Cl.

| H01L 27/088 | (2006.01) |
|---|---|
| H03K 19/00 | (2006.01) |
| H01L 29/08 | (2006.01) |
| H01L 27/06 | (2006.01) |

(52) U.S. Cl.
CPC ..... *H03K 19/0013* (2013.01); *H01L 27/0629* (2013.01); *H01L 29/0852* (2013.01)

(58) Field of Classification Search
CPC ............ H01L 27/0629; H01L 29/0852; H03K 19/0013
See application file for complete search history.

(56) References Cited

U.S. PATENT DOCUMENTS

| 5,929,680 | A | 7/1999 | Lim | |
|---|---|---|---|---|
| 6,466,063 | B2 * | 10/2002 | Chen | H03K 19/0013 326/83 |
| 7,312,626 | B2 | 12/2007 | Forbes | |
| 8,350,253 | B1 * | 1/2013 | Zhu | H01L 21/823807 257/19 |
| 8,680,610 | B2 * | 3/2014 | Hsieh | H01L 29/7813 257/330 |
| 8,969,940 | B1 * | 3/2015 | Yater | H01L 29/42328 257/314 |
| 2005/0168250 | A1 | 8/2005 | Lin | |
| 2009/0189644 | A1 * | 7/2009 | Lee | H03K 5/1252 327/34 |
| 2009/0212838 | A1 * | 8/2009 | Kim | H03K 5/133 327/285 |

(Continued)

OTHER PUBLICATIONS

Abdalla, Y. S.; "Reduction of Short Circuit Current in Static CMOS Inverters Using Novel Smart Delay Generator Circuits"; Accepted Nov. 20, 2011; pp. 83-84; Elektrotech. Inftech. (2012) 129: 83. https://doi.org/10.1007/s00502-012-0079-z, Publisher Name: Springer-Verlag, Print ISSN: 0932-383X.

*Primary Examiner* — Alexander H Taningco
*Assistant Examiner* — Kurtis R Bahr

(57) ABSTRACT

A method and apparatus for reducing dynamic switching current in high speed logic. The apparatus may include a CMOS logic circuit, which in turn includes an NMOS FinFET, a first PMOS FinFET, and a second PMOS FinFET. A gate of the NMOS FinFET is connected to a gate of the first PMOS FinFET, a drain of the NMOS FinFET is connected to a drain of the first PMOS FinFET, and the second PMOS FinFET is connected to the first PMOS FinFET to create a capacitor between a source and the drain of the first PMOS FinFET. In one embodiment, the second PMOS FinFET is contained in and positioned at an edge of a cell that also contains the first PMOS FinFET and the NMOS FinFET.

13 Claims, 10 Drawing Sheets

(56) References Cited

U.S. PATENT DOCUMENTS

| | | | |
|---|---|---|---|
| 2013/0241031 A1* | 9/2013 | Li | H01L 27/115 257/529 |
| 2014/0252487 A1* | 9/2014 | Stephens | H01L 27/088 257/368 |
| 2015/0255461 A1* | 9/2015 | Chintarlapalli Reddy | H01L 27/0924 257/369 |
| 2016/0211264 A1* | 7/2016 | Peng | H01L 21/8221 |

* cited by examiner

US 10,673,435 B2

REDUCTION OF DYNAMIC SWITCHING CURRENT IN HIGH-SPEED LOGIC

BACKGROUND OF THE INVENTION

Complementary metal-oxide-semiconductor (CMOS) technology is widely used in microprocessors, microcontrollers, static RAM, and other circuits that employ digital logic circuits. CMOS digital logic offers relatively high speed, low power dissipation, high noise margins, and will operate over a wide range of input voltages.

CMOS digital logic circuits use a combination of p-type metal-oxide-semiconductor field-effect transistors (PMOS-FET or PMOS for short) and n-type metal-oxide-semiconductor field-effect transistors (NMOSFET or NMOS for short). The "metal" part of the name is a bit misleading. Although some MOSFETs use metal as gates, many modern MOSFETs use polysilicon to form gates.

The PMOS transistor creates low resistance path between its source and drain contacts when a low gate voltage is applied, and high resistance when a high gate voltage is applied. On the other hand, the NMOS transistor creates high resistance path between source and drain when a low gate voltage is applied, and low resistance when a high gate voltage is applied.

BRIEF DESCRIPTION OF THE DRAWINGS

The present technology may be better understood, and its numerous objects, features, and advantages made apparent to those skilled in the art by referencing the accompanying drawings.

The use of the same reference symbols in different drawings indicates similar or identical items unless otherwise noted. The Figures are not necessarily drawn to scale.

DETAILED DESCRIPTION

Figure 1:
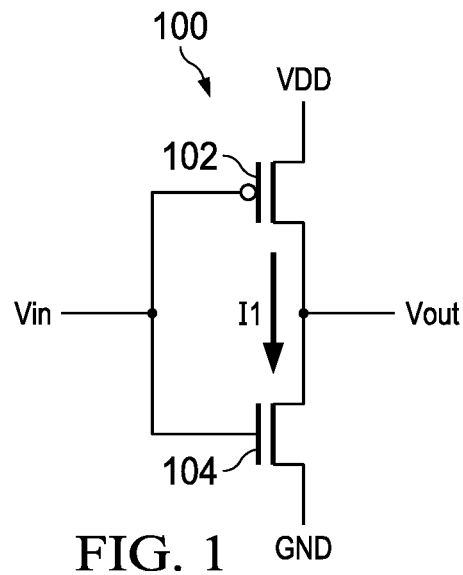
FIG. 1 is a schematic diagram illustrating a CMOS inverter.

As noted CMOS is employed in digital logic circuits (inverters, NAND gates, OR gates, etc.). FIG. 1 illustrates an example CMOS inverter 100 that includes a PMOS transistor 102 and an NMOS transistor 104, the combination of which is connected in series between supply voltage VDD and ground GND. The gates of transistors 102 and 104 are connected together and configured to receive an input signal. The drains are also connected together and configured to provide an output signal, which is the inverse of the input signal.

A high voltage on the gates will cause NMOS transistor 104 to activate and the PMOS transistor 102 to deactivate, while a low voltage on the gates causes the reverse. In both states, little to no current is transmitted through the inverter between VDD and GND. This arrangement greatly reduces power consumption and heat generation, which is important in today's mobile devices such as laptop computers and smart phones that employ thousands of CMOS inverters. However, during the switching time, both transistors briefly conduct current as the gate voltage goes from one state to another. The current conducted during this brief time is often referred to as "crowbar current." Crowbar current induces a brief spike in power consumption and becomes a serious issue at high switching frequencies.

The present technology is directed toward an apparatus for reducing crowbar current. In addition, the present technology can be implemented using structures added to a substrate solely for the purpose of ensuring structural integrity of transistors during fabrication thereof.

In one embodiment of the present technology, crowbar current is reduced by adding capacitance to an inverter or a stage (e.g., an output stage) of another type of digital logic device, to slow the activation of the PMOS transistor during input signal transition, and to speed the deactivation of the PMOS transistor during input signal transition. As one of ordinary skill in the art understand, a capacitor is a passive two-terminal electrical component that stores potential energy in an electric field. The effect of a capacitor is known as capacitance. While some capacitance exists between any two electrical conductors in proximity in a circuit, a capacitor is a component designed to add capacitance to a circuit. The physical form and construction of practical capacitors vary widely. Most capacitors contain at least two electrical conductors often in the form of metallic plates or surfaces separated by a dielectric medium.

Figure 2:
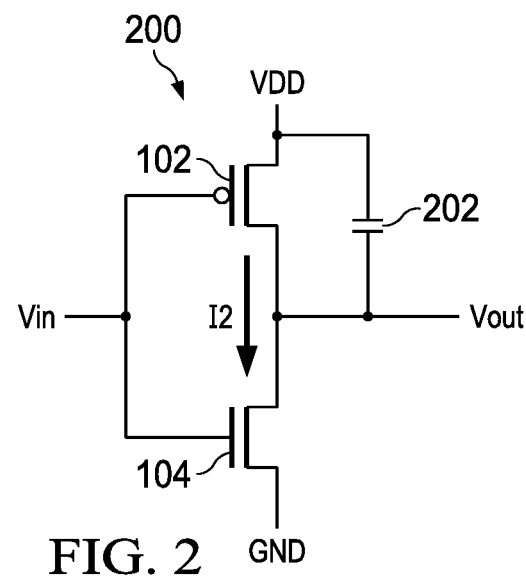
FIG. 2 is a schematic diagram illustrating a CMOS inverter.
Figure 3:
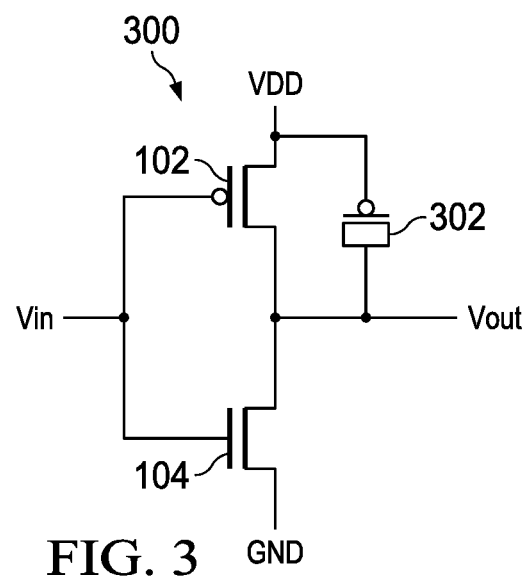
FIG. 3 is a schematic diagram illustrating a CMOS inverter.

FIGS. 2 and 3 illustrates the CMOS inverter 100 of FIG. 1 with a capacitor (hereinafter referred to as an asymmetric hysteresis capacitor or AHC) 202 and 302, respectively, added thereto to affect the transition of the PMOS transistor 102 during transition. As shown the AHC is added by connecting it between the source and drain of the PMOS transistor 102. AHC 302 takes form in a PMOS transistor, the source of drain of which are shorted and electrically connected to the drain of PMOS transistor 102.

Figure 4:
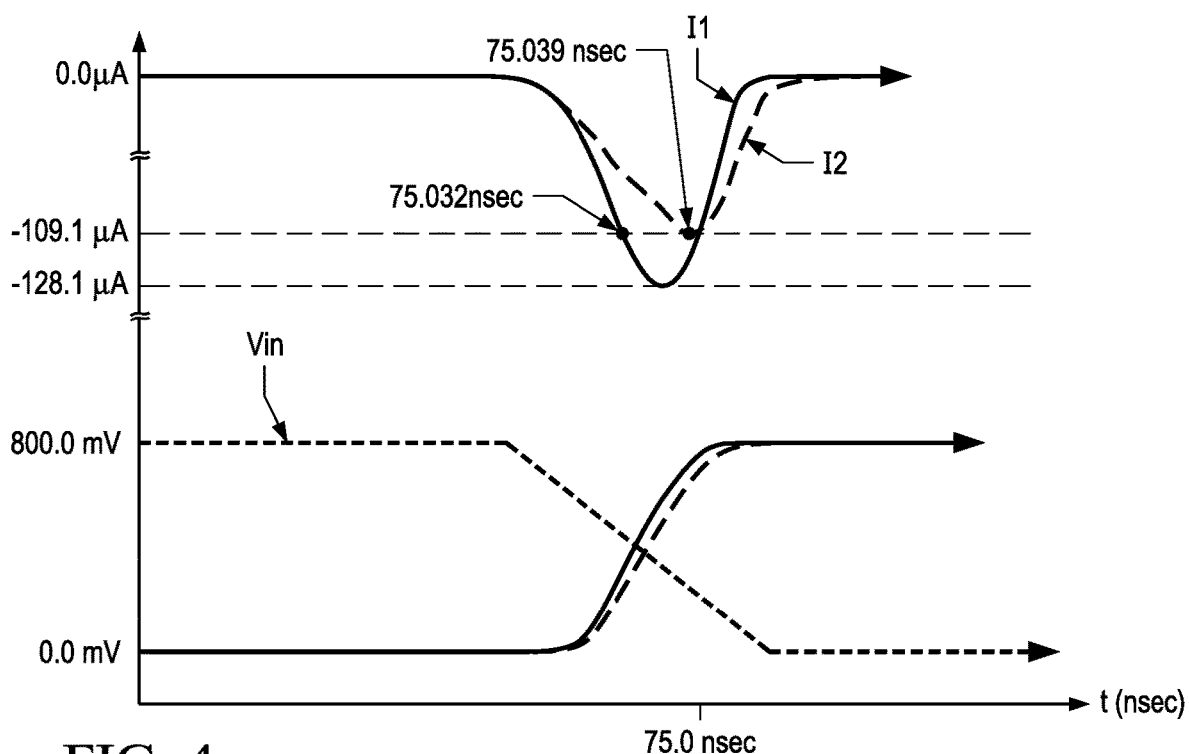
FIG. 4 illustrates results of a computer simulation of the inverters shown in FIGS. 1 and 2.
Figure 5:
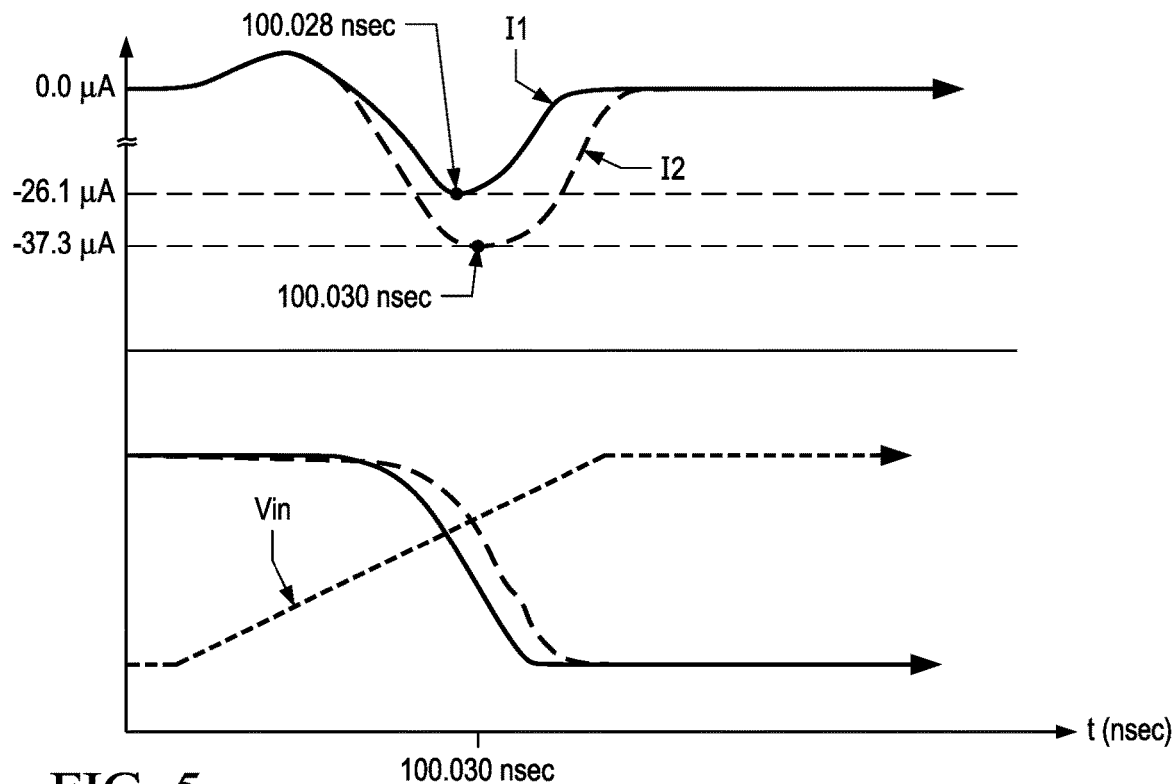
FIG. 5 illustrates results of a computer simulation of the inverters shown in FIGS. 1 and 2.

The inventors listed on this document simulated the inverters shown in FIGS. 1 and 3 using fin MOSFET (FinFET) models for transistors 102, 104 and 302. FIGS. 4 and 5 illustrate results of the simulations. FIGS. 4 and 5 show input signal Vin, output signal Vout, and current flow through the inverters of FIGS. 1 and 3 during switching operations. In FIG. 4, Vin switches from high to low, and in FIG. 5 Vin switches from low to high. FIG. 4 shows that in the high to low transition, the peak current is reduced (from 128.051 uA to 109.058 uA), while FIG. 5 shows that in the high to low transition, there is a little spike (increase) in the current (from 26.134 uA to 37.252 uA). The total in peak current (crowbar) savings in using AHC 302 is (128.051 uA-109.058 uA)-(37.252-26.134 uA)=7.875 uA. The savings in crowbar current should improve with increasing switching frequency of Vin. It is noted that Vout is substantially equal for both inverters.

A FinFET is a type of MOSFET transistor built on a substrate where the gate is placed on multiple sides of the channel or wrapped around the channel. When the gate is wrapped around the channel, the device is often referred to as a gate all around (GAA) MOSFET. These devices have been given the generic name "FinFETs" because the source/drain region forms fins on the semiconductor surface.

FinFETs provide advantages over traditional planar MOSFETs in high performance and low power applications. Major semiconductor foundries are adopting FinFET technology for CMOS semiconductor device fabrication. The present technology will be described with reference to FinFETs it being understood that the present technology should not be limited to use with FinFETs.

Figure 6:
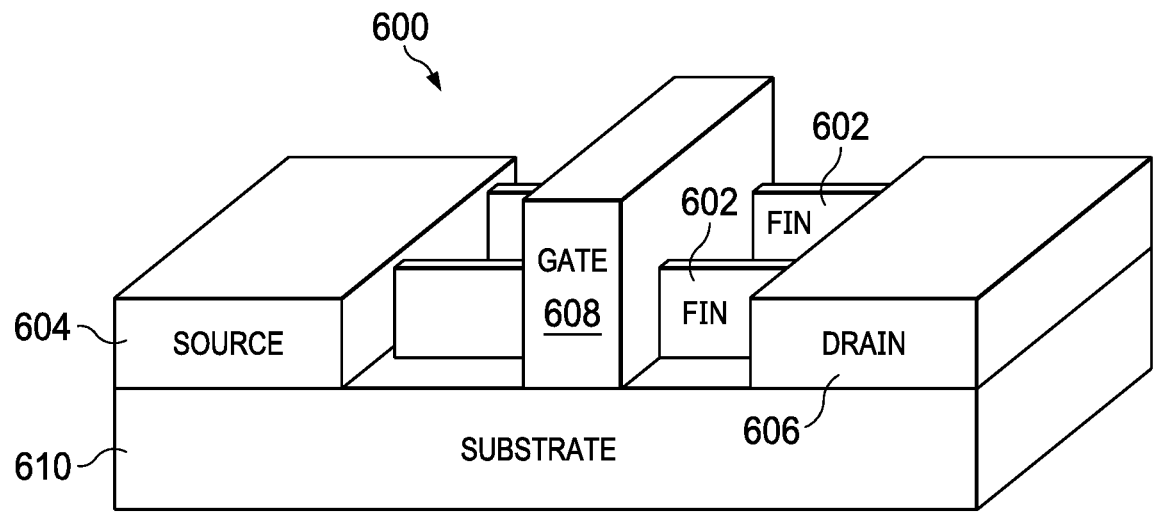
FIG. 6 is a three dimensional view of an example FinFET.

FIG. 6 illustrates a three dimensional view of an example FinFET. The view shown in FIG. 6 is somewhat exaggerated to better show the structural characteristics of typical FinFETs, which, as will be explained below, can create challenges during fabrication. FinFET 600 includes two fins 602 that extend between source 604 and drain 606. Each fin 602 is surrounded on three sides by a polysilicon gate 608. Although not shown in FIG. 6, gate 608 is insulated and/or electrically isolated from fins 602, source 604 and drain 606.

Figure 7A:
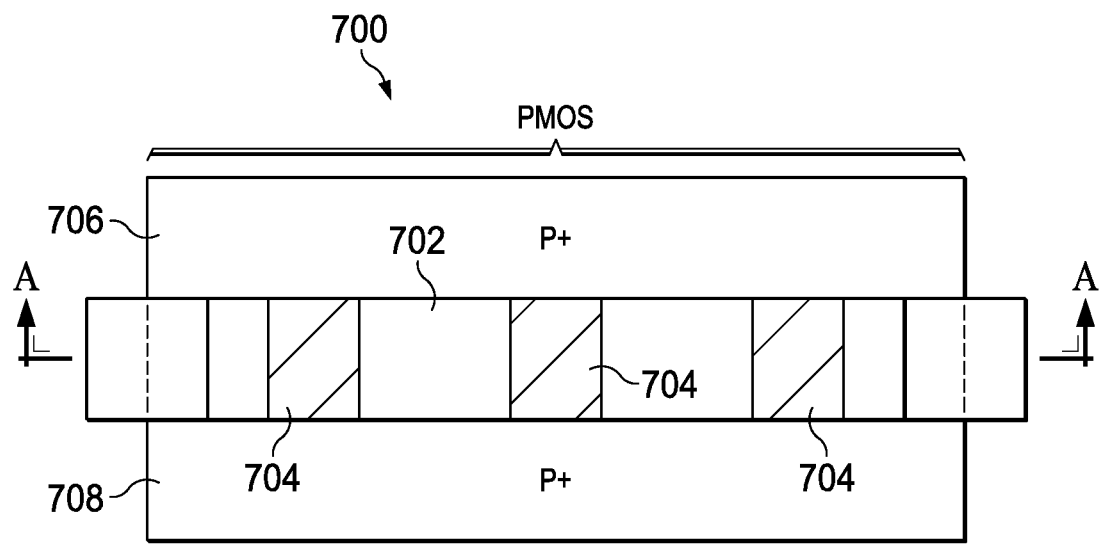
FIG. 7A is a top view of an example FinFET.
Figure 7B:
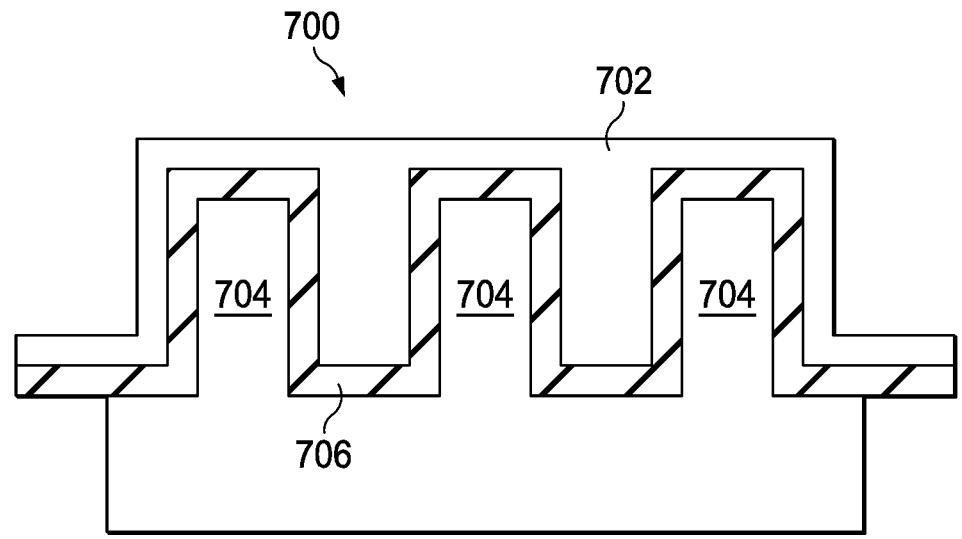
FIG. 7B is a cross sectional view of the FinFET shown in FIG. 7A.
Figure 7C:
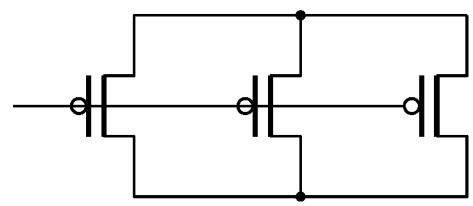
FIG. 7C is a schematic illustration of the FinFET shown in FIGS. 7A and 7B.
Figure 7D:
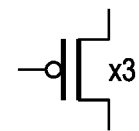
FIG. 7D is a schematic illustration of the FinFET shown in FIGS. 7A and 7B.

FIG. 7A illustrates a top view of an example three fin FinFET 700 formed on a substrate, and FIG. 7B illustrates a cross-sectional view of FinFET 700 taken along line A-A. FinFET 700 includes a polysilicon gate 702 that surrounds fins 704 on three sides thereof. Gate 702 can be formed from metal in other embodiments. An insulating later 706 separates polysilicon gate 702 from fins 704. When a threshold voltage is applied to gate 702, a low resistance, conducting channel is created in fins 704, thereby electrically connecting source 706 and drain 708. FIGS. 7C and 7D are schematic representations of a three fin FinFET such as that shown in FIGS. 7A and 7B. The "x3" symbol in FIG. 7D indicates the FinFET includes three fins. Other embodiments may include a greater or lesser number of fins.

Figure 8:
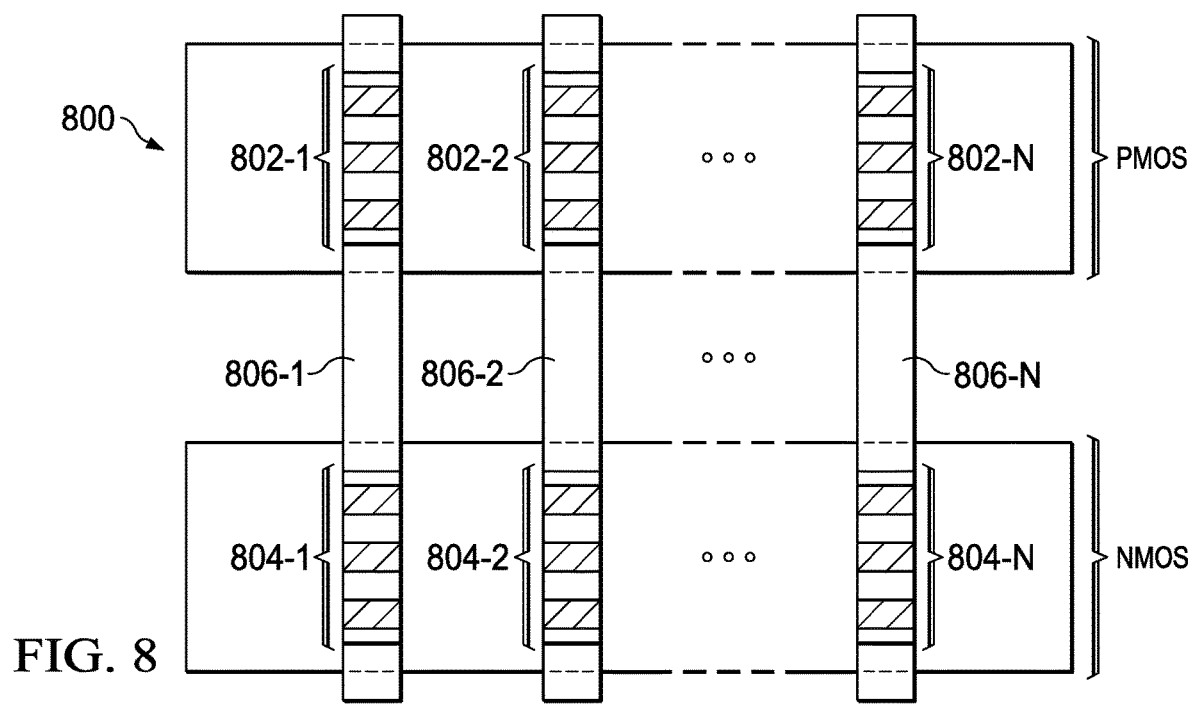
FIG. 8 is a top view of an example cell in a substrate.
Figure 9:
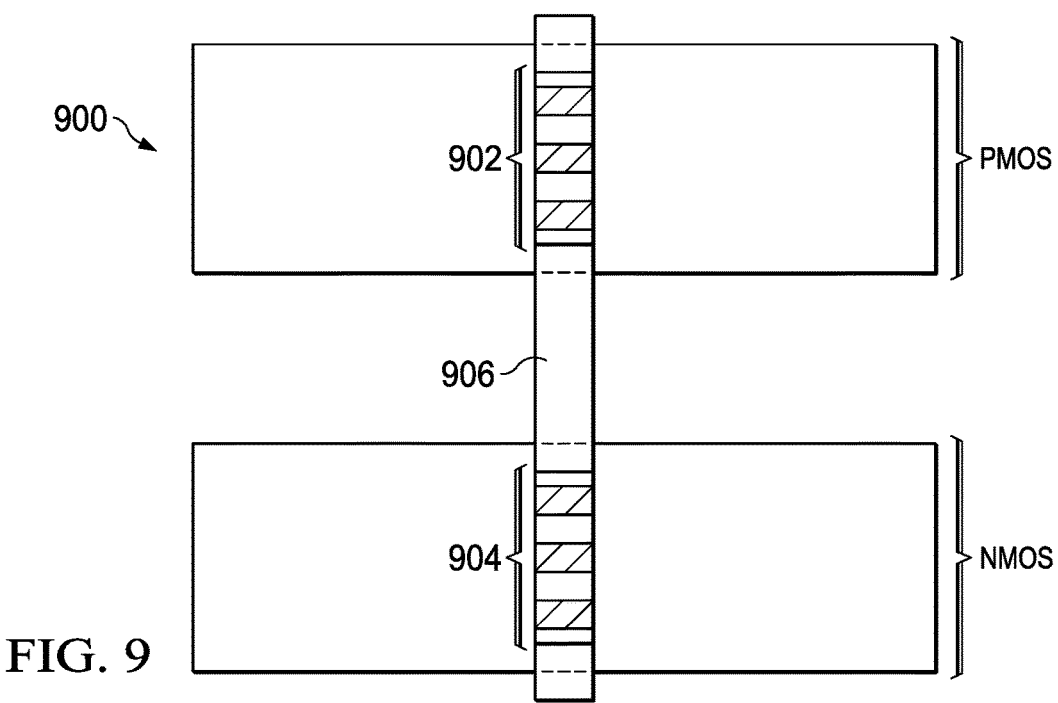
FIG. 9 is a top view of an example cell in a substrate.

FIGS. 8 and 9 illustrate top views of CMOS cell examples 800 and 900, respectively formed on a substrate using a front end of line (FEOL) fabrication technique. Standard CMOS cells are positioned on substrates and form the basis for creating digital logic circuits. Each of the CMOS cells 800 and 900 contain corresponding PMOS and NMOS FinFETs. The CMOS cell 800 shown in FIG. 8 includes a group of three PMOS FinFETs 802, and a group of three NMOS FinFETs 804. Polysilicon strips 806 form common gates for corresponding FinFETs 802 and 804. Because the gates share common polysilicon strips 806, gates for FinFETs 802 are electrically connected to gates of FinFETs 804, respectively. One or more of these polysilicon strips 806 can be cut to electrically isolate corresponding NMOS and PMOS FinFETs when forming digital logic circuits. The cell shown in FIG. 8 can be wired during a back end of line (BEOL) fabrication technique to create a complex digital logic circuit.

The CMOS cell 900 in FIG. 9 includes a single PMOS FinFET 902 and a single NMOS FinFET 904. Polysilicon strip 906 form common gates for FinFETs 902 and 904. Because the gates share common polysilicon strip 906, the gates of FinFETs 902 and 904 are electrically connected to each other. The cell shown in FIG. 9 can be wired during standard BEOL fabrication techniques to create a CMOS inverter like that shown in FIG. 1.

Figure 10A:
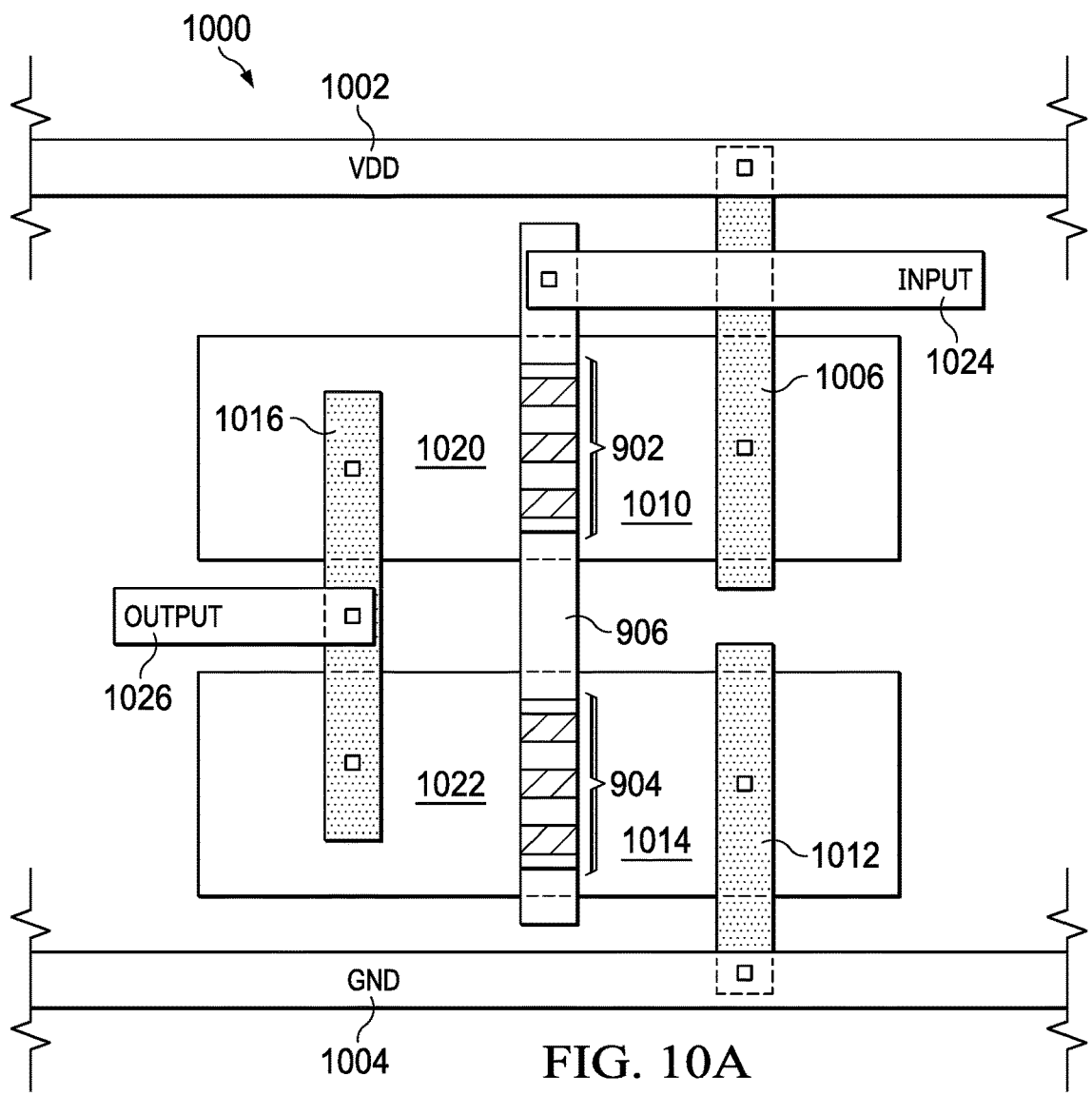
FIG. 10A is a top view of the example cell shown in FIG. 9 after wiring is added thereto.
Figure 10B:
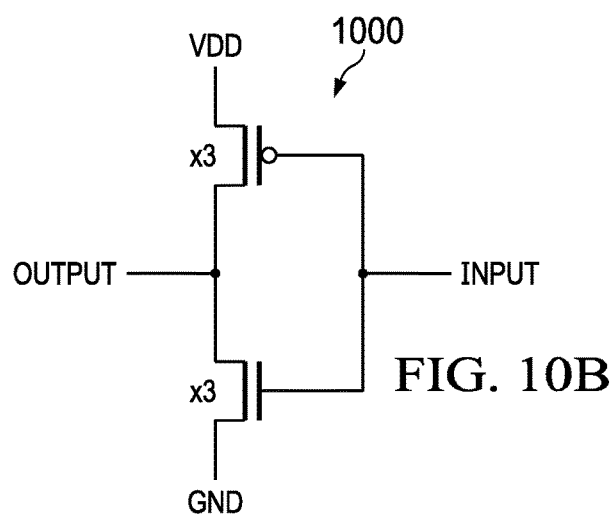
FIG. 10B is a schematic illustration of the device shown in FIG. 10A.

FIGS. 8 and 9 show cells within a semiconductor substrate that contain isolated FinFETs (i.e., without any wires). Interconnect wires, contacts (pads), vias, etc., can be added during BEOL. FIG. 10A shows cell 900 of FIG. 9 after metal wires and contacts are added to create CMOS inverter 1000. FIG. 10B is a schematic representation of the inverter 1000 shown in FIG. 10A.

With continuing reference FIGS. 10A and 10B, metal wires 1002 and 1004 provide supply voltage VDD and ground GND, respectively. Metal wire 1006 connects VDD to source 1010 through contacts, which are represented in the figures as small squares. Metal wire 1012 connects GND to source 1014 through respective contacts. Metal wire 1016 connects drains 1020 and 1022 through respective contacts. Metal wire 1024 is connected to polysilicon strip 906 through a contact and is configured to provide an input signal to the gates of FinFETs 902 and 904. Metal wire 1026 is configured to provide an output signal of inverter 1000 and is connected to the drains 1020 and 1022 through metal wire 1016 and respective vias. As an aside, one more corresponding PMOS and NMOS FinFETs in FIG. 8, such as corresponding FinFETs 802-N and 806-N, can be wired to create an inverter similar to that shown in FIG. 10A Importantly, inverter 1000 shown in FIG. 10A lacks an AHC.

Figure 11:
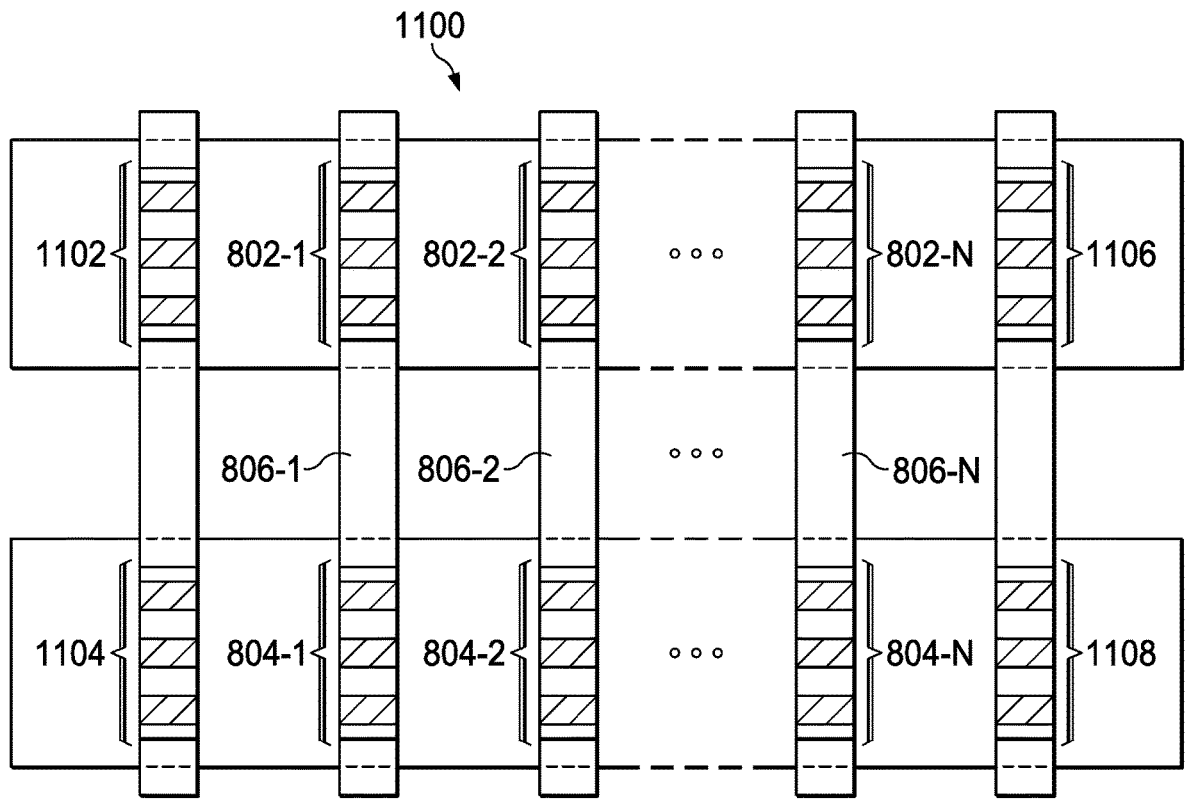
FIG. 11 is a top view of the example cell shown in FIG. 8 with dummy structures added thereto.
Figure 12:
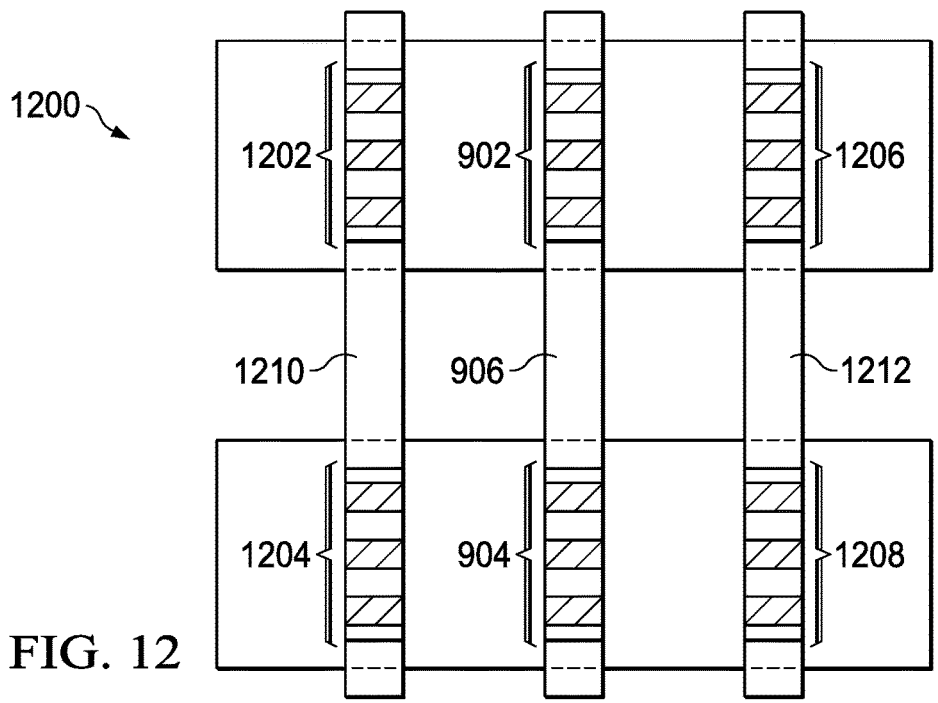
FIG. 12 is a top view of the example cell shown in FIG. 9 with dummy structures added thereto.

FinFETs are being manufactured with smaller and smaller dimensions. Integrated circuit fabrication is a multiple-step FEOL process and a multiple-step BEOL process. The FEOL portion of fabrication involves photolithographic processing steps, mechanical processing steps, chemical processing steps, etc. As FinFET dimensions decrease these processing steps introduce stresses to the substrate that can degrade or deform the physical structures of the FinFETs to the point that they may not function as predicted. Chemical mechanical polishing (CMP) is an example of a process step that can severely deform FinFETs 902 and 904 under some circumstances. Edge device degradation is among the major challenges for the FinFET fabrication process. Unfortunately, a large gap between adjacent FinFETs increases the chances that the adjacent FinFETs will be deformed by, for example, chemical mechanical processing. However, "dummy" structures (e.g., FinFETs also called dummy poly) can be added to the edges of cells or in large gaps between adjacent FinFETs to reduce the chances of FinFET deformation during fabrication. These dummy FinFETs can smooth out the stresses created by the processing steps and better ensure that adjacent structures (FinFETs) are formed properly and function as predicted. To illustrate, FIG. 11 shows a top view of cell 800 with dummy structures (e.g., FinFETs) 1102-1108 added to the edges thereof. These dummy FinFETs help to reduce deformation of FinFETs 802-1, 804-1, 802-N, and 804-N. And FIG. 12 illustrates a top view of cell 900 with dummy FinFETs 1202-1208 added to the edges thereof. Because FinFETs 902 and 904 are positioned between dummy FinFETs 1202-1208 as shown, FinFETs 902 and 904 should not degrade during certain FEOL processing steps, and can be wired during the BEOL processing to create a CMOS inverter that functions according to predictive models. It should be noted that the dummy FinFETs, prior to the present disclosure, were not wired during FEOL for the purpose of creating AHCs.

Figure 13A:
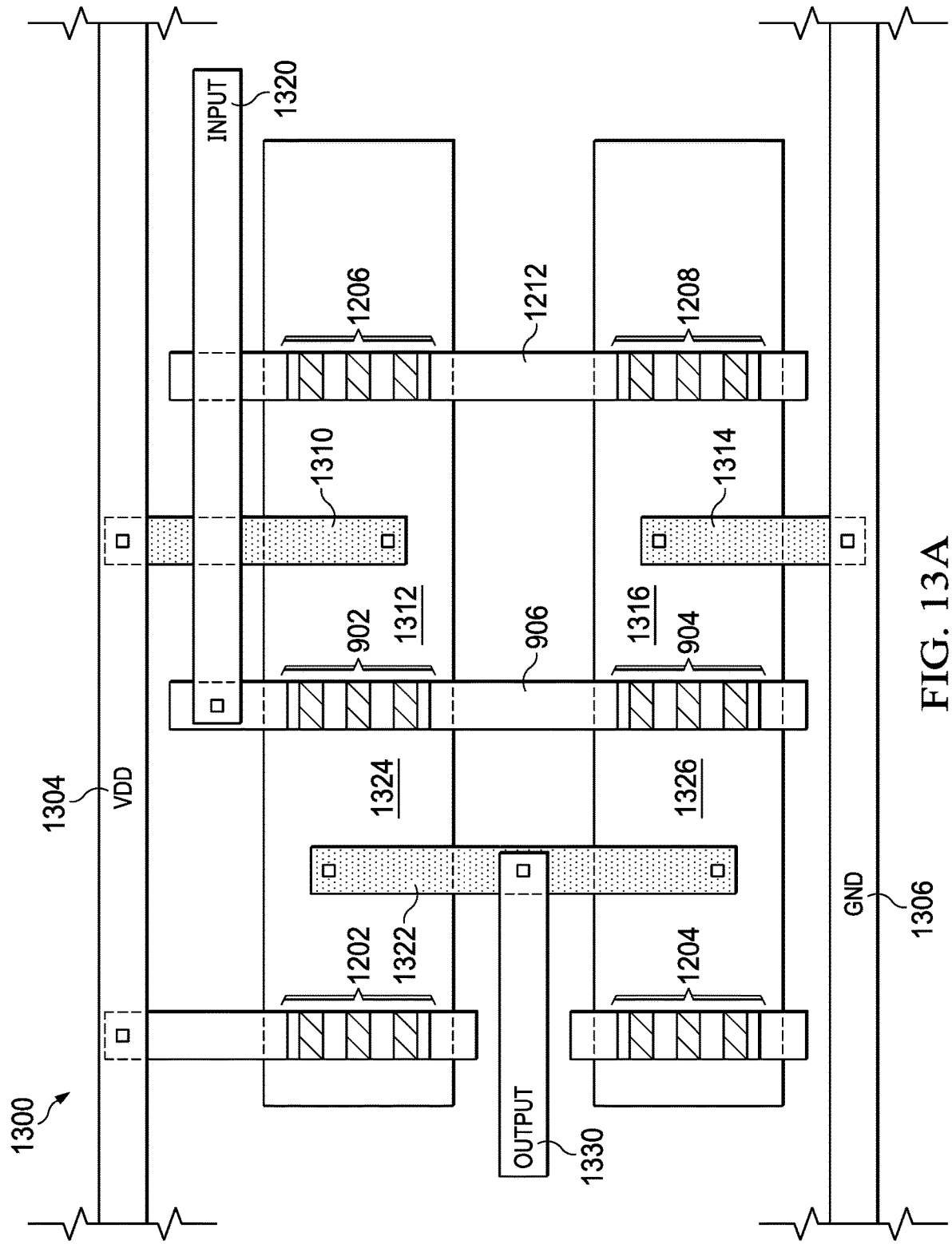
FIG. 13A is a top view of the example cell shown in FIG. 12 after wiring is added thereto.
Figure 13B:
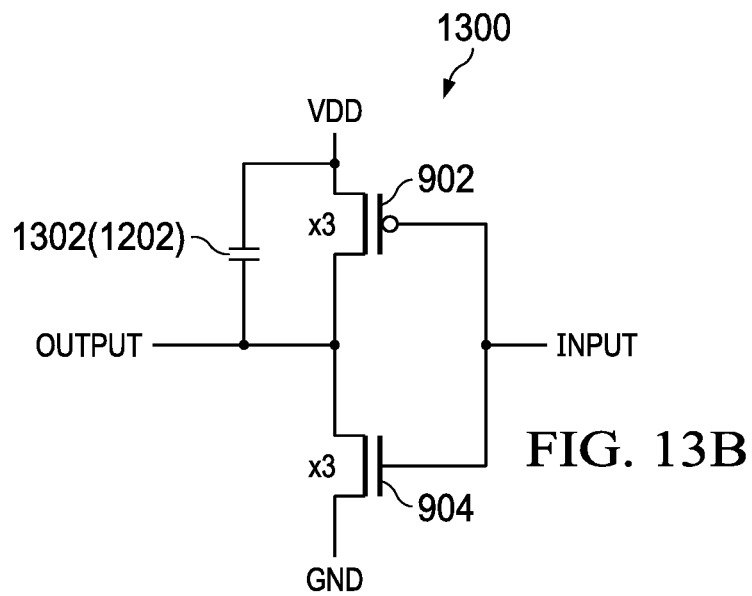
FIG. 13B is a schematic illustration of the device shown in FIG. 13A.
Figure 14B:
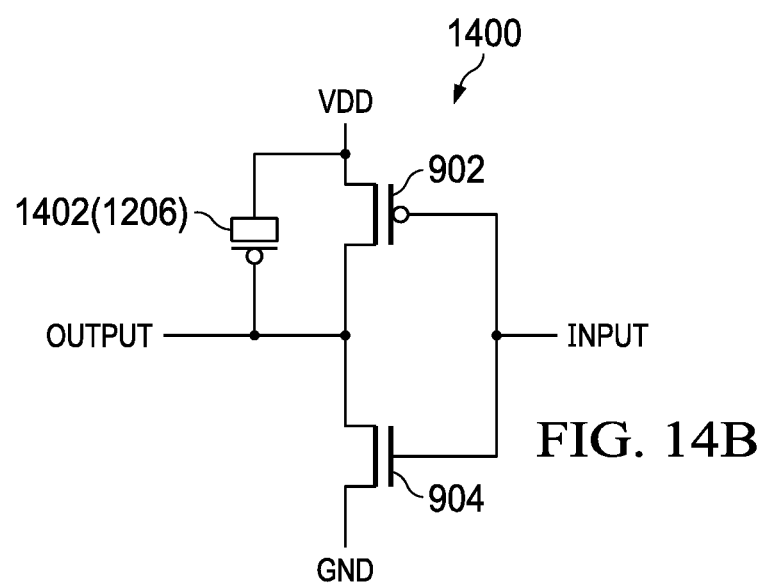
FIG. 14B is a schematic illustration of the device shown in FIG. 13A.
Figure 14A:
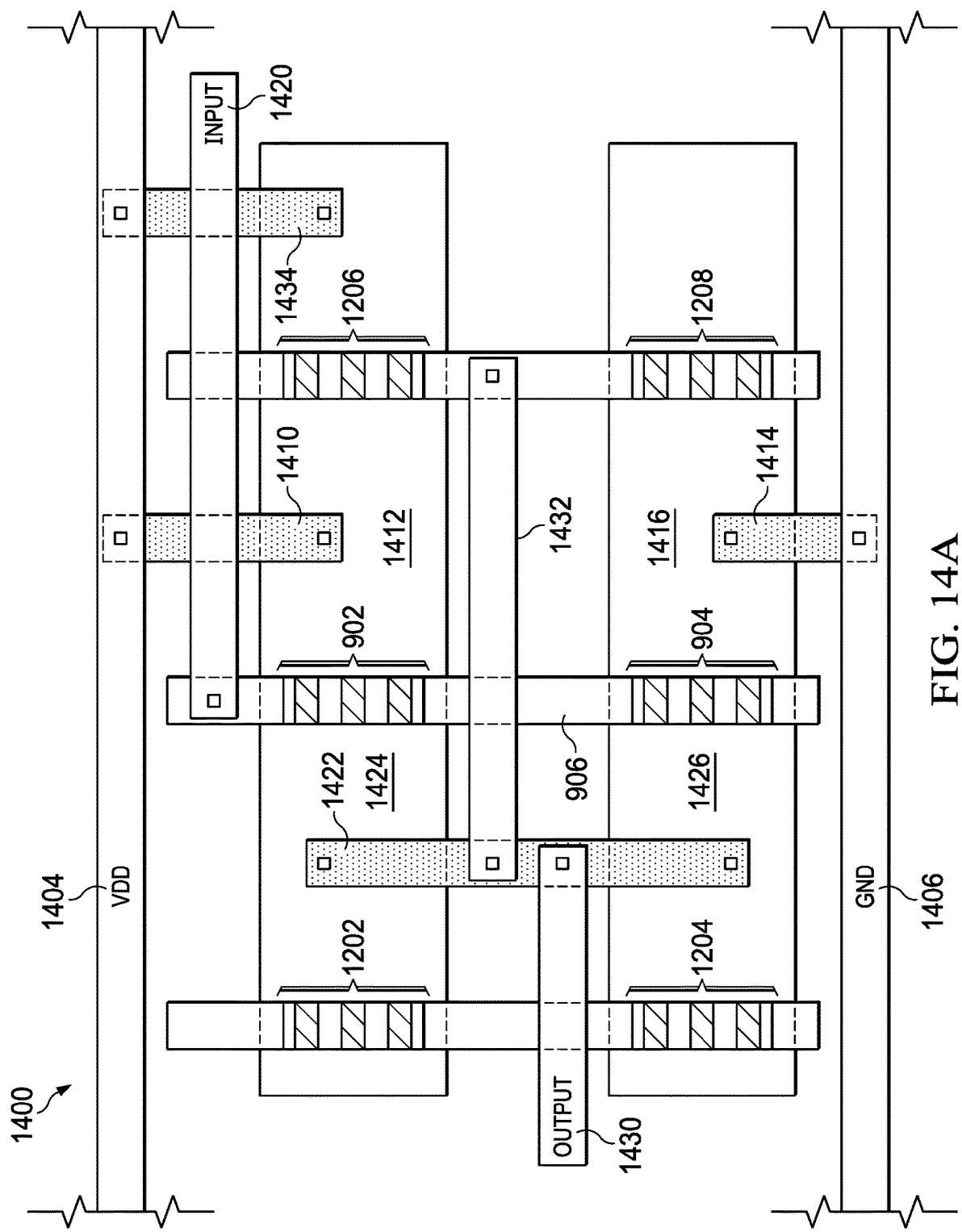
FIG. 14A is a top view of the example cell shown in FIG. 12 after wiring is added thereto.

Dummy structures, such as the dummy FinFETs shown in FIG. 11 and FIG. 12, are added for the purpose of ensuring structural integrity of structures such FinFET's 902 and 904. However these dummy structures can be further exploited. For example, a dummy FinFET, or components thereof, shown in FIG. 12 can be wired to create an AHC for reducing crowbar current. FIGS. 13A and 14A illustrate CMOS inverters 1300 and 1400, respectively, with added AHC to reduce crowbar current. The AHCs are formed using dummy FinFETs. FIGS. 13B and 14B illustrates schematic diagrams of inverters 1300 and 1400, respectively. FIGS. 13B and 14B show AHCs 1302 and 1402, respectively, connected between the source and drain of FinFET 902. AHC 1402 takes form in a dummy FinFET with its gate connected the drain of the PMOS FinFET, and with its source and drain connected together and to the source of the PMOS FinFET.

CMOS inverters 1300 and 1400 are slightly modified versions of the base cell 1200 shown in FIG. 12. Polysilicon strip 1210 is severed thereby creating separated dummy FinFETs 1202 and 1204 in FIG. 13A. Moreover, polysilicon strip 1210 is extended to enable connection with supply voltage VDD. The gate of dummy FinFET 1202 forms one terminal of AHC 1302 as will be more fully described below. In FIG. 14A polysilicon strip 1212 is severed thereby creating separated dummy FinFETs 1206 and 1208. The gate of FinFET 1206 forms one terminal of AHC 1402 as will be more fully described below.

With continuing reference to FIG. 13A, metal wires 1304 and 1306 provide supply voltage VDD and ground GND, respectively. Vias, contacts and metal wire 1310 connect VDD to source 1312 of FinFET 902, while vias, contacts and metal wire 1314 connect GND to source 1316 of FinFET 904. Vias, contacts and metal wire 1322 connect drains 1324 and 1326. A via, contact and metal wire 1320 provide a connection between an input signal and polysilicon strip 906, which in turn provides the input signal to the gates of FinFETs 902 and 904. Metal wire 1330 is electrically connected to metal wire 1322 and is configured to provide an output signal of inverter 1300. As an aside, one more corresponding PMOS and NMOS FinFETs in FIG. 11, such as corresponding FinFETs 802-N and 804-N, can be wired to create an inverter similar to that shown in FIG. 13A. Importantly, inverter 1300 includes an AHC. More particularly, one terminal on the AHC 1302 takes form in the gate of dummy FinFET 1202, which is electrically connected to the source 1312 of FinFET 902 via, contact and metal wires 1304 and 1310, while the other terminal of AHC 1302 takes form in drain 1324 proximate to the gate of dummy FinFET 1202.

With continuing reference to FIG. 14A, metal wires 1404 and 1406 provide supply voltage VDD and ground GND, respectively. Vias, contacts and metal wire 1410 connect VDD to source 1412 of FinFET 902, while vias, contacts and metal wire 1414 connect GND to source 1416 of FinFET 904. Vias, contacts and metal wire 1422 connect drains 1424 and 1426. A via, contacts and metal wire 1420 provide a connection between an input signal and polysilicon strip 906, which in turn provides the input signal to the gates of FinFETs 902 and 904. Metal wire 1430 connects to metal wire 1422 and is configured to provide an output signal of inverter 1400. As an aside, one more corresponding PMOS and NMOS FinFETs in FIG. 11, such as corresponding FinFETs 802-N and 804-N, can be wired to create an inverter similar to that shown in FIG. 14A. Inverter 1400 includes AHC 1402. More particularly, one terminal of the AHC 1402 takes form in gate of dummy FinFET 1206, which is connected to drain 1424 of FinFET 902 via, contact and metal wires 1432 and 1422, while the other terminal of AHC 1402 takes form in the source and drain of dummy FinFET 1210A, which are shorted together via metal wires 1410 and 1434.

A circuit has been disclosed for reducing dynamic switching current in high-speed logic. The circuit can be made by fabricating fin field-effect transistors (FinFETs) on a substrate, wherein fabricating the FinFETs includes fabricating an NMOS FinFET, a first PMOS FinFET and a second PMOS FinFET. A gate of the NMOS FinFET is connected to a gate of the first PMOS FinFET. A drain of the NMOS FinFET is connected to a drain of the first PMOS FinFET. The second PMOS FinFET is connected to the first PMOS FinFET to create a capacitor between a source and the drain of the first PMOS FinFET.

The second PMOS FinFET can be contained in and positioned at an edge of a cell that also contains the first PMOS FinFET and the NMOS FinFET.

The fabrication of the FinFETs may further include fabricating a third PMOS FinFET, wherein the first PMOS FinFET is positioned between the second and third PMOS FinFETs.

The second PMOS FinFET may be a dummy FinFET.

The second PMOS FinFET can be positioned adjacent to the first PMOS FinFET to ensure that the first PMOS FinFET is fabricated to operate according to computer simulation models.

The fabrication of the FinFETs may include chemical mechanical polishing of the substrate, wherein the second PMOS FinFET is positioned on the substrate to reduce the chance that structure of the first PMOS FinFET is degraded during the chemical mechanical polishing of the substrate.

The capacitor may include first and second terminals, wherein the first terminal includes a gate of the second PMOS FinFET that is connected to a source of the first PMOS FinFET, and wherein the second terminal includes the drain of the first PMOS FinFET.

The capacitor may include first and second terminals, wherein the first terminal comprises a gate of the second PMOS FinFET that is connected to the drain of the first PMOS FinFET, and wherein the second terminal comprises a source of the first PMOS FinFET.

A source of the first PMOS FinFET, the source of the second PMOS FinFET, and a drain of the second PMOS FinFET may be connected together.

A CMOS logic circuit is disclosed that includes an NMOS FinFET, a first PMOS FinFET, and a second PMOS FinFET. A gate of the NMOS FinFET is connected to a gate of the first PMOS FinFET. A drain of the NMOS FinFET is connected to a drain of the first PMOS FinFET. The second PMOS FinFET is connected to the first PMOS FinFET to create a capacitor between a source and the drain of the first PMOS FinFET.

The second PMOS FinFET of the CMOS logic circuit may be contained in and positioned at an edge of a cell that also contains the first PMOS FinFET and the NMOS FinFET.

The CMOS logic circuit may also include a third PMOS FinFET, wherein the first PMOS FinFET is positioned between and immediately adjacent to the second and third PMOS FinFETs.

The second PMOS FinFET of the CMOS logic circuit may a dummy FinFET.

The second PMOS FinFET of the CMOS logic circuit may be positioned adjacent to the first PMOS FinFET to ensure that the first PMOS FinFET is fabricated to operate according to computer simulation models.

The capacitor of the CMOS logic circuit may include first and second terminals, wherein the first terminal comprises a gate of the second PMOS FinFET that is connected to a source of the first PMOS FinFET, and wherein the second terminal comprises the drain of the first PMOS FinFET.

The capacitor of the CMOS logic circuit may include first and second terminals, wherein the first terminal comprises a gate of the second PMOS FinFET that is connected to the drain of the first PMOS FinFET, and wherein the second terminal comprises a source of the first PMOS FinFET.

A source of the first PMOS FinFET, the source of the second PMOS FinFET, and a drain of the second PMOS FinFET of the CMOS logic circuit may be connected together.

In another embodiment a CMOS logic circuit is disclosed that includes a N-type MOSFET, a P-type MOSFET, and a capacitor. A gate of the N-type MOSFET is connected to a gate of the P-type MOSFET. A drain of the N-type MOSFET is connected to a drain of the P-type MOSFET. The capacitor is connected between a source of the P-type MOSFET and the drain of the P-type MOSFET. The capacitor may include first and second terminals, wherein the first terminal includes a gate of another P-type MOSFET, which is positioned immediately adjacent to the P-type MOSFET, and wherein the gate of the other P-type MOSFET is connected to the source or the drain of the P-type MOSFET.

This description uses the terms "connected" or "coupled." The term coupled is broader than the term connected. The term connected means a direct connection between devices such as transistors. In other words, there is no device intervening between two connected devices, other than parasitic capacitance, inductance, and/or resistance between the devices. In contrast, two devices can be "coupled" together either directly (i.e., connected), or indirectly via an intervening device.

The fabrication of NMOS and PMOS transistors involves light passing through photomasks in a process called optical lithography. As dimensions (e.g., channel length) of the transistors become smaller, the process can lose its accuracy. The quality is lost due to diffraction of light around the corners and edges of the photomask since the features are too small compared to the wavelength of the light. This results in uneven edges, shorts or complete absence of layers to be etched. Double patterning can be employed to address these limitations. In double patterning, dense patterns of in a single photomask is split between two different photomasks that can be interleaved to get the original pattern as desired. Although this increases the complexity of the lithography process by adding additional steps, smaller features can be obtained. Also, dummy structures such as dummy FinFETs can be added on one or both sides of a polysilicon gate to help minimize adverse effects to the gate that may occur after patterning (e.g., the strips are used to help minimize the effects of undercutting the polysilicon after patterning).

The present technology described above is implemented with FinFETs. Other types of transistors such as planar transistors can be used in other embodiments. AHCs are described above in the form of transistors configured as capacitors. AHCs can also take form in conventional capacitors. The present technology can be exploited using transistors created with advanced bulk processes such as 28 bulk, which require dummy structures. However, there may be advantages to using FinFETs since they may provide larger parasitic capacitances when compared to, for example, planar transistors.

Although the present invention has been described in connection with several embodiments, the invention is not intended to be limited to the specific forms set forth herein. On the contrary, it is intended to cover such alternatives, modifications, and equivalents as can be reasonably included within the scope of the invention as defined by the appended claims.

What is claimed is:

1. A method of fabricating a CMOS logic circuit on a substrate, the method comprising:
   fabricating fin field-effect transistors (FinFETs) on the substrate, wherein fabricating the FinFETs comprises fabricating an NMOS FinFET, a first PMOS FinFET and a second PMOS FinFET;
   wherein a gate of the NMOS FinFET is connected to a gate of the first PMOS FinFET;
   wherein a drain of the NMOS FinFET is connected to a drain of the first PMOS FinFET;
   wherein a gate of the second PMOS FinFET is separated from the drain of the first PMOS FinFET by an insulator to create a capacitor between the gate of the second PMOS FinFET and the drain of the first PMOS FinFET, and wherein the gate of the second PMOS FinFET is connected to a supply voltage conductor, which in turn is connected to a source of the first PMOS FinFET.

2. The method of claim 1 wherein the second PMOS FinFET is contained in and positioned at an edge of a cell that also contains the first PMOS FinFET and the NMOS FinFET.

3. The method of claim 1 wherein the fabricating the FinFETs further comprises fabricating a third PMOS FinFET, wherein the first PMOS FinFET is positioned between the second and third PMOS FinFETs, and wherein the third PMOS FinFET comprises a permanently floating gate.

4. The method of claim 1 wherein the fabricating the FinFETs further comprises fabricating a third PMOS FinFET, wherein the first PMOS FinFET is positioned between the second and third PMOS FinFETs, and wherein the third PMOS FinFET comprises a gate that is not connected to a metal conductor.

5. The method of claim 1 wherein the fabricating the FinFETs comprises chemical mechanical polishing of the substrate, wherein the second PMOS FinFET is positioned on the substrate to reduce the chance that structure of the first PMOS FinFET is degraded during the chemical mechanical polishing of the substrate.

6. The method of claim 1 wherein the fabricating the FinFETs further comprises fabricating a third PMOS FinFET, wherein the first PMOS FinFET is positioned between the second and third PMOS FinFETs, and wherein the third PMOS FinFET comprises a gate that is not connected during a back end of line (BEOL) of the fabricating.

7. The method of claim 1 wherein the fabricating the FinFETs further comprises fabricating a third PMOS FinFET, wherein the first PMOS FinFET is positioned between the second and third PMOS FinFETs, and wherein the third PMOS FinFET is a dummy FinFET.

8. The method of claim 1 wherein the source of the first PMOS FinFET, the source of the second PMOS FinFET, and a drain of the second PMOS FinFET are connected together.

9. A CMOS logic circuit comprising:
   a first NMOS FinFET;
   a second NMOS FinFET;

a third NMOS FinFET;
a first PMOS FinFET;
a second PMOS FinFET;
a third PMOS FinFET;
wherein the first PMOS FinFET is positioned between the second and third PMOS FinFETs;
wherein the first NMOS FinFET is positioned between the second and third NMOS FinFETs;
wherein a gate of the first NMOS FinFET is connected to a gate of the first PMOS FinFET;
wherein a drain of the first NMOS FinFET is connected to a drain of the first PMOS FinFET;
wherein the second PMOS FinFET is connected to the first PMOS FinFET to create a capacitor between a source and the drain of the first PMOS FinFET;
wherein the third PMOS FinFET and the third NMOS FinFETs are dummy FinFETs;
wherein the capacitor comprises first and second terminals, wherein the first terminal comprises a gate of the second PMOS FinFET that is connected to a source of the first PMOS FinFET, and wherein the second terminal comprises the drain of the first PMOS FinFET.

10. The CMOS logic circuit of claim 9 wherein the second PMOS FinFET is contained in and positioned at an edge of a cell that also contains the first PMOS FinFET and the first NMOS FinFET.

11. The CMOS logic circuit of claim 9 wherein the first PMOS FinFET is positioned between and immediately adjacent to the second and third PMOS FinFETs.

12. The CMOS logic circuit of claim 9 wherein the FinFETs were fabricated using chemical mechanical polishing of the substrate, wherein the second PMOS FinFET is positioned on the substrate to reduce the chance that structure of the first PMOS FinFET is degraded during the chemical mechanical polishing of the substrate.

13. The CMOS logic circuit of claim 9 wherein the first PMOS FinFET and the second PMOS FinFET have the same number of fins.

* * * * *